United States Patent
Sohn et al.

(10) Patent No.: US 7,759,263 B2
(45) Date of Patent: Jul. 20, 2010

(54) METHODS FOR FABRICATING IMPROVED GATE DIELECTRICS

(75) Inventors: Woong-Hee Sohn, Seoul (KR);
Gil-Heyun Choi, Seoul (KR);
Byung-Hee Kim, Seoul (KR);
Byung-Hak Lee, Suwon-si (KR);
Tae-Ho Cha, Sungnam-si (KR);
Hee-Sook Park, Seoul (KR); Jae-Hwa Park, Yongin-si (KR); Geum-Jung Seong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 446 days.

(21) Appl. No.: 11/806,338

(22) Filed: May 31, 2007

(65) Prior Publication Data

US 2008/0014700 A1   Jan. 17, 2008

(30) Foreign Application Priority Data

Jul. 12, 2006   (KR)   ............ 10-2006-0065535

(51) Int. Cl.
*H01L 21/336*   (2006.01)
(52) U.S. Cl. ............... 438/787; 438/216; 438/287; 438/981; 257/E29.133
(58) Field of Classification Search ............... None
See application file for complete search history.

(56) References Cited

U.S. PATENT DOCUMENTS

| | | | |
|---|---|---|---|
| 5,610,430 A * | 3/1997 | Yamashita et al. | 257/412 |
| 5,825,046 A | 10/1998 | Czubatyj et al. | |
| 6,136,674 A | 10/2000 | An et al. | |
| 6,329,666 B1 | 12/2001 | Doan et al. | |
| 6,743,688 B1 * | 6/2004 | Gardner et al. | 438/305 |
| 6,770,550 B2 * | 8/2004 | Kunikiyo | 438/585 |
| 6,979,858 B2 * | 12/2005 | Saito et al. | 257/315 |
| 7,183,143 B2 * | 2/2007 | Wang | 438/149 |
| 7,256,096 B2 * | 8/2007 | Kim | 438/305 |
| 7,402,484 B2 * | 7/2008 | Shin et al. | 438/231 |
| 7,528,042 B2 * | 5/2009 | Lim et al. | 438/279 |
| 2002/0048970 A1 * | 4/2002 | Feudel et al. | 438/787 |
| 2003/0109090 A1 | 6/2003 | Bertin et al. | |

FOREIGN PATENT DOCUMENTS

JP   2002-319674   10/2002

(Continued)

*Primary Examiner*—Thanh V Pham
*Assistant Examiner*—Andres Munoz
(74) *Attorney, Agent, or Firm*—Harness, Dickey & Pierce, P.L.C.

(57) ABSTRACT

Disclosed are a variety of methods for increasing the relative thickness in the peripheral or edge regions of gate dielectric patterns to suppress leakage through these regions. The methods provide alternatives to conventional GPOX processes and provide the improved leakage resistance without incurring the degree of increased gate electrode resistance associated with GPOX processes. Each of the methods includes forming a first opening to expose an active area region, forming an oxidation control region on the exposed portion and then forming a second opening whereby a peripheral region free of the oxidation control region is exposed for formation of a gate dielectric layer. The resulting gate dielectric layers are characterized by a thinner central region surrounded or bounded by a thicker peripheral region.

16 Claims, 17 Drawing Sheets

FOREIGN PATENT DOCUMENTS

| KR | 1019990042916 | 6/1999 |
| KR | 10-2000-0004531 | 1/2000 |
| KR | 10-2002-0070099 | 9/2002 |
| KR | 10-2003-0086820 | 11/2003 |
| KR | 1020050014226 | 2/2005 |

\* cited by examiner

METHODS FOR FABRICATING IMPROVED GATE DIELECTRICS

PRIORITY STATEMENT

This non-provisional application claims priority under 35 U.S.C. §119(a) on Korean Patent Application No. 2006-65535, which was filed in the Korean Patent Office on Jul. 12, 2006, the content of which is herein incorporated, in its entirety, by reference.

BACKGROUND

1. Field of Endeavor

The example embodiments relate to methods of forming improved gate dielectric structures useful in semiconductor processing, methods of forming semiconductor devices incorporating such gate dielectric structures and semiconductor devices that utilize such gate dielectric structures.

2. Description of the Related Art

Efforts to increase levels of integration in electronic devices including, for example, integrated circuits and display devices incorporating such integrated circuits, and reduce the overall size of the electronic devices have resulted in design rules that reflect decreasing critical dimensions. For example, more aggressive design rules may reduce the spacing of adjacent active regions within the devices and/or variations in conductor width, the spacing of electrode patterns, the thickness of dielectric layers and the sizing of dielectric structures formed during fabrication of such devices. One of the challenges facing process development engineers is defining processes for fabricating structures that comply with the design rules, exhibit satisfactory performance and are within the capabilities of the equipment and materials utilized in the fabrication.

As the width of the gate structures and the thickness of the gate dielectric materials are reduced, the etch processes conventionally utilized for forming the gate structures can damage the peripheral portions of the gate dielectric material, thereby reducing the effective density and increasing the likelihood of current leakage through such regions. Excessive gate leakage will tend to compromise the performance and/or the reliability of the resulting devices and is, therefore, a result to be reduced or avoided where possible.

One method for addressing the gate leakage issue is a Gate Poly Oxidation ("GPOX") in which a peripheral portion of the gate electrode structure adjacent the gate dielectric is oxidized in order to increase the thickness of the peripheral portion of the gate dielectric pattern, thereby suppressing leakage paths through those regions. Although this method may improve the performance of the gate dielectric, oxidizing a portion of the gate electrode pattern, particularly those gate electrodes that incorporate one or more silicide materials, also tends to increase the resistance of the gate electrode. Increases in the gate electrode resistance, however, tends to impede the propagation of electrical signals through the semiconductor device and may thereby compromise the performance of the resulting device.

SUMMARY OF EXAMPLE EMBODIMENTS

Example embodiments include methods of fabricating semiconductor devices comprising, forming a mask pattern on a semiconductor substrate, wherein the mask pattern includes first openings having a width $W_1$ that expose first regions of the semiconductor substrate; forming an oxidation control region by nitriding a surface portion of the exposed first regions; removing portions of the mask pattern adjacent the first openings to form second openings having a width $W_2$, wherein $W_2 > W_1$, thereby exposing peripheral portions of the semiconductor substrate bounding the oxidation control region; oxidizing the exposed semiconductor substrate to form a dielectric pattern wherein a central region has a first average thickness $T_c$ and wherein peripheral regions adjacent the central region have a second average thickness $T_p$, wherein $T_p > T_c$.

Additional example embodiments may also include forming a conductive pattern on the dielectric pattern; removing the mask pattern to expose second regions of the semiconductor substrate; forming spacer structures on opposite sidewalls of the conductive pattern covering peripheral regions of the second regions and thereby defining source/drain regions between adjacent portions of the conductive pattern; implanting a dopant into the semiconductor substrate in the source/drain region to form source/drain structures.

Additional example embodiments may also include forming a conductive pattern on the dielectric pattern; removing the mask pattern to expose second regions of the semiconductor substrate; implanting a dopant into the semiconductor substrate in the exposed second regions to form source/drain structures and forming spacer structures on opposite sidewalls of the conductive pattern covering peripheral regions of the second regions. Additional example embodiments may also include implanting a dopant into the exposed second regions of the semiconductor substrate before forming the spacer structures to form a lightly-doped drain (LDD) structure.

Additional example embodiments may also include fabricating semiconductor devices in which the first average thickness $T_c$ and the second average thickness $T_p$ have a ratio that is no greater than 0.5; forming the hard mask pattern by forming a thermal oxide layer having a thickness $T_t$ on the semiconductor substrate; and depositing a CVD oxide having a thickness $T_{cvd}$ on the thermal oxide layer, wherein the ratio $T_{cvd} : T_t$ is at least 3; nitriding the surface portions of the exposed first regions by exposing the surface portions to an activated nitrogen containing ambient including, for example, forming the activated nitrogen ambient using a method selected from a group including, for example, in-situ plasma generation, remote plasma generation, nitrogen annealing, nitrogen ion implantation and rapid thermal nitridation. Example embodiments may utilize a variety of nitrogen source gases including, for example, $N_2$, $NH_3$, $NO$, $N_2O$ and mixtures thereof.

Additional example embodiments may also include forming the first and second openings whereby the width of the first opening $W_1$ is no more than 80% of the width of the second openings $W_2$ and perhaps no more than 70% of the width of the second openings $W_2$. Additional example embodiments may also include fabricating a semiconductor device whereby the central region has a first dielectric composition having a first average nitrogen content $C_{N1}$ and wherein peripheral regions adjacent the central region have a second dielectric composition having a second average nitrogen content $C_{N2}$, wherein $C_{N1} > C_{N2}$.

Additional example embodiments may include forming a pad oxide layer on a semiconductor substrate; forming a polysilicon layer on the pad oxide layer; patterning and etching the polysilicon layer and the pad oxide layer to form a mask pattern having first openings having a width $W_1$ that expose first regions of the semiconductor substrate; forming a capping oxide layer on exposed sidewall and top polysilicon surfaces of the mask pattern; forming spacer structures adjacent sidewalls of the mask pattern covering peripheral portions of the first regions to form second openings having a width $W_2$, wherein $W_2<W_1$; depositing a first insulating layer to a thickness sufficient to fill the second openings; removing an upper portion of the first insulating layer to form a first insulating pattern and expose the top polysilicon surface of the mask pattern; removing the mask pattern to form third openings having a width $W_3$ that expose second regions of the semiconductor substrate; forming an oxidation control region by nitriding a surface portion of the exposed second regions; removing the capping oxide to form fourth openings having a width $W_4$, wherein $W_4>W_3$, thereby exposing peripheral regions of the semiconductor substrate bounding the oxidation control region; oxidizing the exposed semiconductor substrate to form a dielectric pattern wherein a central region has a first average thickness $T_c$ and wherein peripheral regions adjacent the central region have a second average thickness $T_p$, wherein $T_p>T_c$.

Additional example embodiments may include forming a conductive pattern on the dielectric pattern; removing the first insulating pattern to define source/drain regions between spacer structures on the sidewalls of adjacent portions of the conductive pattern; and implanting a dopant into the semiconductor substrate in the source/drain regions to form source/drain structures. As will be appreciated by those skilled in the art, forming the S/D regions may also include implanting a light dose of a dopant into the source/drain regions; and forming second spacers adjacent the spacers before implanting the dopant to form the source/drain structures.

Additional example embodiments may include forming a pad oxide layer on a semiconductor substrate; forming a mask layer on the pad oxide layer, wherein the mask layer has an etch rate $R_m$ in a first etch process; patterning and etching the mask layer and the pad oxide layer to form a mask pattern having first openings having a width $W_1$ that expose first regions of the semiconductor substrate; forming a conformal insulating layer on the mask pattern and the first regions of the semiconductor substrate, wherein the insulating layer exhibits a first etch rate $R_{i1}$ in the first etch process and the expression $R_{i1}>R_m$ is satisfied, and further wherein the insulating layer exhibits a second etch rate $R_{i2}$ in a second etch process; forming spacers on sidewalls of the conformal insulating layer using a spacer material that exhibits an etch rate $R_s$ in the second etch process, wherein $R_s>R_{i2}$; etching the conformal insulating layer using the spacers as etch masks to remove the conformal insulating layer in second openings having a width $W_2$, wherein $W_1>W_2$, and to remove the conformal insulating layer from top surfaces of the mask pattern; forming an oxidation control region by nitriding a surface portion of the semiconductor substrate exposed in the second openings; removing the spacer structures and residual portions of the conformal insulating layer to open the first openings, thereby exposing peripheral regions of the semiconductor substrate bounding the oxidation control region; oxidizing the exposed semiconductor substrate to form a dielectric pattern wherein a central region has a first average thickness $T_c$ and wherein peripheral regions adjacent the central region have a second average thickness $T_p$, wherein $T_p>T_c$.

Additional example embodiments may include fabricating a semiconductor device by forming a conductive pattern on the dielectric pattern; removing the mask pattern to expose second regions of the semiconductor substrate; forming spacer structures on opposite sidewalls of the conductive pattern to cover peripheral portions of the second regions and thereby define source/drain regions between the spacer structures on adjacent portions of the conductive pattern; implanting a dopant into the semiconductor substrate in the source/drain region to form source/drain structures. Further example embodiments may include implanting a dopant into the exposed second regions of the semiconductor substrate before forming the spacer structures to form a lightly-doped drain (LDD) structure.

Additional example embodiments may include, in order, forming a pad oxide layer on a semiconductor substrate; forming a mask layer on the pad oxide layer, wherein mask layer is formed from material exhibiting an etch rate $R_m$ in a first etch process, and further wherein a silicon oxide exhibits an etch rate $R_{ox}$ in the first etch process, wherein $R_{ox}>R_m$; patterning and etching the mask layer and the pad oxide layer to form a mask pattern having first openings having a width $W_1$ that expose first regions of the semiconductor substrate; removing a thickness of the semiconductor substrate from the first regions to form trench structures having a depth $D_t$ measured from a reference plane defined by an original surface of the semiconductor substrate; depositing a first insulating layer to a thickness sufficient to fill the trench structures; removing an upper portion of the first insulating layer to form a first insulating pattern, expose an upper surface of the mask pattern and form a planarized surface; etching the mask pattern to form spacer structures adjacent sidewalls of the first insulating pattern and second openings having a width $W_2$ that expose second regions of the semiconductor substrate; forming an oxidation control region by nitriding a surface portion of the semiconductor substrate exposed in the second openings; removing the spacer structures to form third openings, thereby exposing peripheral portions of the semiconductor substrate bounding the oxidation control region; oxidizing the exposed semiconductor substrate to form a dielectric pattern wherein a central region has a first average thickness $T_c$ and wherein peripheral regions adjacent the central region have a second average thickness $T_p$, wherein $T_p>T_c$.

The example embodiments may also include forming a floating gate structure on the dielectric pattern; removing an upper portion of the first insulating pattern; forming a second insulating layer on the floating gate structure and residual portions of the first insulating pattern; forming a control electrode on the second insulating layer, which may include a composite layer having a silicon oxide/silicon nitride/silicon oxide (ONO) structure. Other example embodiments include forming spacer structures adjacent sidewalls of the floating gate structure as well as, for example, removing an upper portion of the first insulating pattern; forming a charge storing layer on the dielectric pattern and residual portions of the first insulating pattern; forming a blocking layer on the charge storing layer; forming a control gate structure on the blocking layer.

BRIEF DESCRIPTION OF THE DRAWINGS

Example embodiments described below will be more clearly understood when the detailed description is considered in conjunction with the accompanying drawings, in which.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. As noted above, one issue associated with MOS semiconductor fabrication, particularly with highly integrated devices, is preventing damage to and/or weakness in the gate oxide, particularly the peripheral regions of the gate dielectric, for example, silicon oxide. As will be appreciated by those skilled in the art, the initial gate dielectric fabrication tends to produce a relatively uniform dielectric layer in the active regions of the substrate. Additional layers of conductive materials are then formed on the gate dielectric, patterned and etched to produce the gate electrode pattern. Both the inherent configuration of gate electrode structures fabricated in this manner, which tends to produce higher electrical fields at the edge or peripheral regions and/or damage to the peripheral regions of the gate dielectric during the etch process(es) utilized in forming the gate electrode pattern will tend to increase the leakage through the peripheral regions.

One technique that has been used for suppressing this leakage through the peripheral regions of the gate dielectric, particularly with regard to silicon dioxide gates, relies on a second oxidation process in which a portion of a polysilicon layer incorporated in the gate electrode adjacent the gate dielectric is oxidized. This secondary oxidation, which is also referred to as Gate Poly Oxidation (GPOX) increases the thickness of the gate oxide in the peripheral regions, thereby increasing the resistance of the gate electrode structure to leakage through the peripheral regions. This secondary oxidation, however, can also result in the oxidation of other conductive materials present in the gate electrode including, for example, metal silicides and metal nitrides, thereby increasing the resistance of the gate electrode and tending to reduce the performance of the resulting device.

Figure 1A:
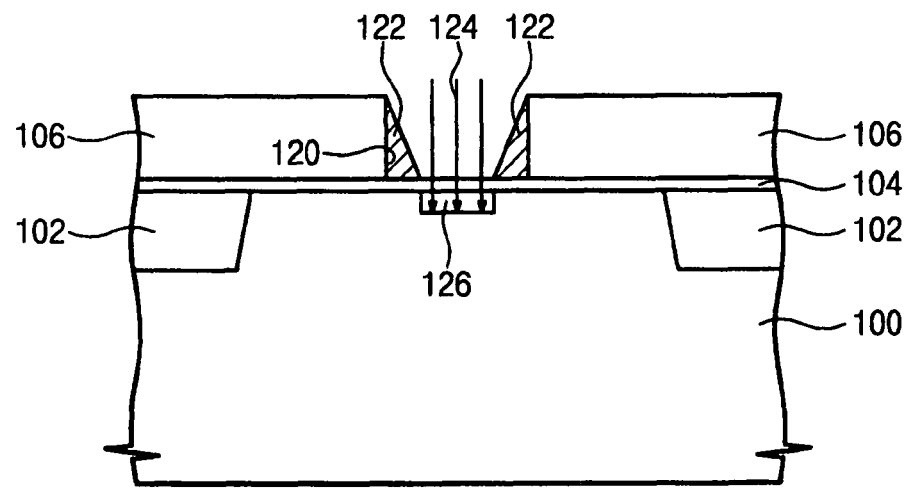
FIGS. 1A and 1B are cross-sectional representations of conventional isolation structures.
Figure 1B:
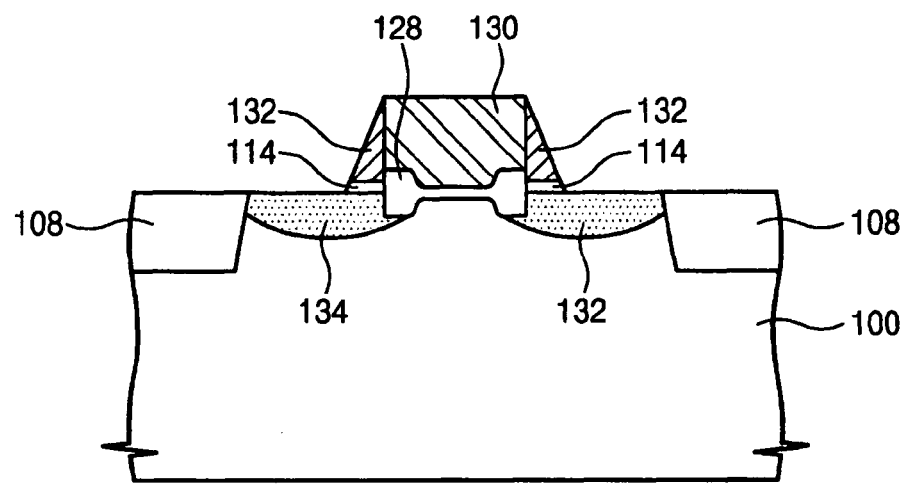

Another technique that has been used for suppressing this leakage through the peripheral regions of the gate dielectric is illustrated in FIGS. 1A and 1B. As illustrated in FIG. 1A, an opening 120 is formed in a layer of a hard mask material to expose a portion of the active region. Sacrificial sidewall spacers 122 are then formed on the sidewalls of the opening 120, thereby reducing the size of the active region exposed by the hard mask. An oxidation inhibiting region 126 is then formed by an ion implant process using the sidewall spacers 122 in combination with the hard mask as an implant mask for implant species 124.

As illustrated in FIG. 1B, the sidewall spacers 122 are then removed to expose the oxidation inhibiting region 126 and a peripheral region of the active region that had been protected by the sidewall spacers. The exposed portion of the active region is then oxidized to form a gate dielectric structure 128 exhibiting a thicker oxide region in the edge or peripheral regions and a thinner oxide region in the central oxidation inhibiting region.

Example embodiments of methods according to the disclosure may include forming an opening in a hard mask layer, forming an oxidation control region in the region of the substrate exposed through the opening, enlarging the opening and oxidizing the initially exposed and newly exposed regions of the substrate to form a gate dielectric layer, forming a gate electrode and source/drain (S/D) regions adjacent the gate electrode.

Figure 2A:
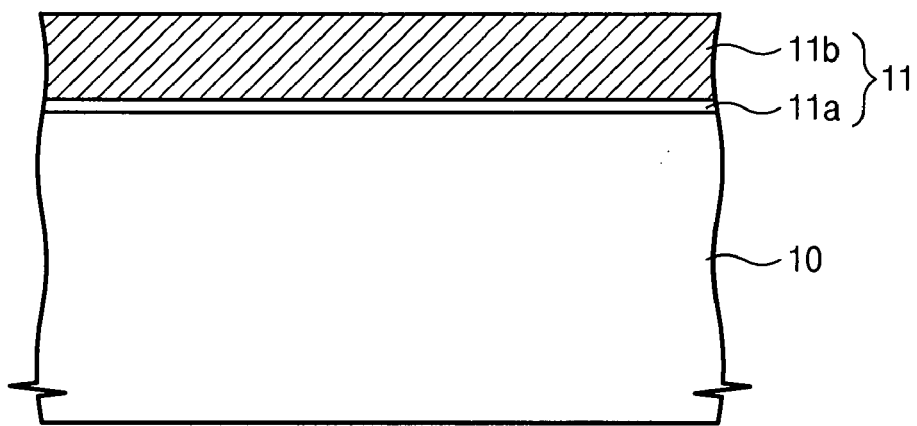
FIGS. 2A-2G are cross-sectional representations of a first example embodiment of a method for forming isolation structures and the resulting trench isolation structures.
Figure 2B:
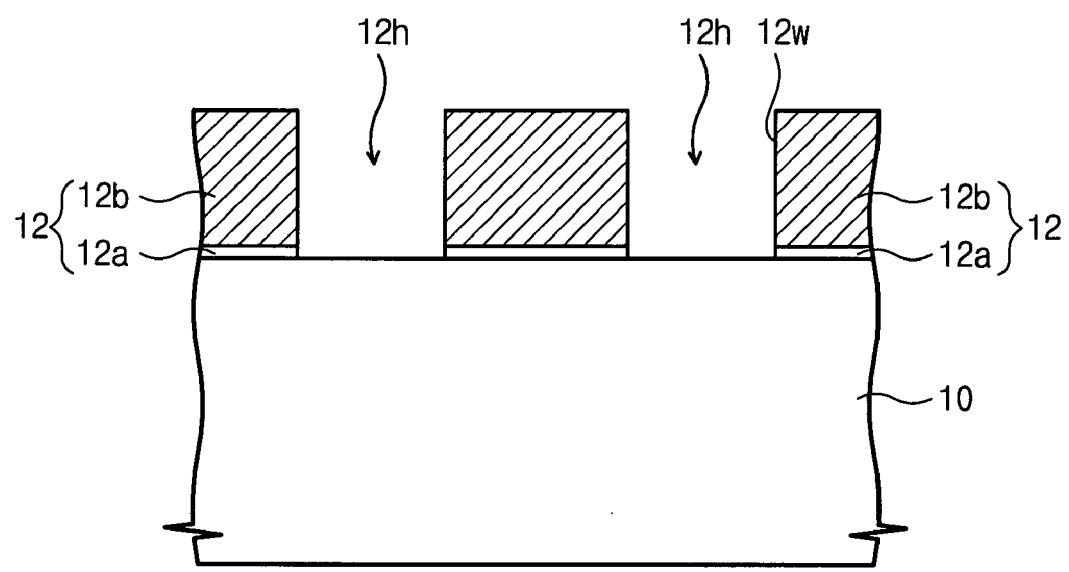

A first example embodiment is illustrated in FIGS. 2A-2G. As illustrated in FIG. 2A, a hard mask layer 11 is formed on the substrate 10. The hard mask layer 11 may include, for example, both an initial layer 11a of, for example, silicon oxide or other suitable base material and a secondary layer 11b of a compatible material, for example, a CVD oxide layer. As illustrated in FIG. 2B, the hard mask layer 11 may be patterned using a photoresist layer (not shown) and then subjected to an appropriate combination of etch processes to clear the hard mask layer material from the unprotected regions, thereby forming first openings 12h that expose portions of the substrate. The remaining portions of the hard mask layer 11 form a hard mask pattern 12 that may comprise both an initial pattern 12a formed from, for example, a thermal oxide, and a secondary pattern 12b formed from, for example, a CVD oxide. The mask pattern 12 includes a sidewalls 12w defining the shape and size of the first openings 12h. The first openings may be formed using critical dimension targets that are a fraction of the target sizing of the gate electrodes that will be utilized in the finished semiconductor device. As will be appreciated by those skilled in the art, the target percentage of the first opening will depend on the performance targets and the process capabilities of the associated patterning and etching processes, but it is expected that first openings in the range of 70 to 85 percent of the target gate electrode sizing, and particularly about 80 percent, may be utilized in forming suitable structures.

Figure 2C:
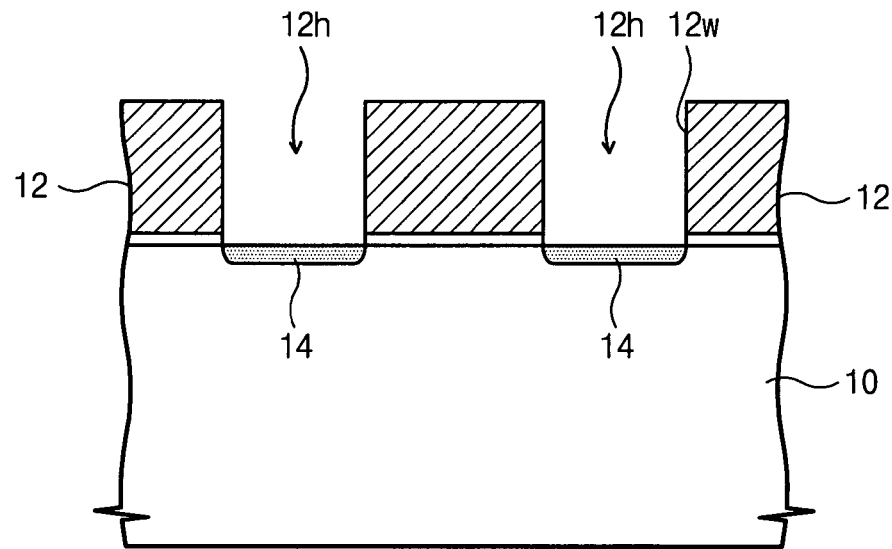

As illustrated in FIG. 2C, an oxidation control layer or region 14 is formed on the portion of the substrate 10 that has been exposed through the first openings 12h by nitriding the exposed silicon surface to form the oxidation control layer of silicon nitride (SiN). The nitridation of the exposed silicon surface may be achieved using a variety of techniques including, for example, plasma nitridation using, for example, one or more nitrogen source gases selected from a group consisting of $N_2$, $NH_3$, NO and $N_2O$. As will be appreciated by those skilled in the art, the flow rate utilized for the nitrogen source gas will depend on a variety of parameters including, for example, the size of the reaction chamber, the number of wafers being processes and the rate at which the nitrided region is to be fabricated an may range, for example, from 10-2000 sccm.

In plasma nitridation, the plasma is generated from the nitrogen source gas(es), as well as any additional inert, carrier or diluent gases, within the reaction or process chamber. Although, as will be appreciated by those skilled in the art the particular parameters will be both process and equipment dependent, heating the substrate to a nitridation temperature on the order of 900° C. while supplying power on the order of 100-300 W to a reaction chamber containing the nitrogen source gas(es) and, in some instances, additional gases, maintained at a pressure from about 10 mTorr to 10 Torr.

In remote plasma nitridation (RPN), however, the nitriding plasma is formed in a remote chamber using one or more nitrogen-containing source gases selected, for example, from a group including $N_2$, $NH_3$, NO and $N_2O$, with the plasma being subsequently supplied to the process chamber in which the wafers or other substrates are maintained at an appropriate temperature and under a suitable pressure. In the anneal method, the patterned wafer, including the exposed regions of the substrate is heated in a furnace under an atmosphere including a nitrogen-containing gas, for example, one or more of $N_2$, $NH_3$, NO and $N_2O$, to a temperature of, for example, 300-900° C.

Rapid thermal nitridation (RTN), is similar in some ways to the furnace anneal method, but utilizes quartz lamps or other high capacity heaters to heat the wafers very rapidly. RTN processes may be utilized with a nitrogen-containing ambient and/or in combination with an ion implant process in which, prior to the rapid anneal, nitrogen-containing ions are implanted into the substrate at one or more implant energy levels to provide a nitrogen distribution within the substrate material. The RTN process, by limiting the time during which the substrate is exposed to the higher temperatures, can suppress lateral diffusion of the various dopant species relative to conventional furnace annealing and/or reduce the overall thermal budget of the fabrication process, thereby permitting the fabrication of higher density semiconductor devices. As will be appreciated by those skilled in the art, the various nitridation techniques can be used in combination to provide a range of nitridation and thermal budgets suitable for a range of fabrication processes.

Figure 2D:
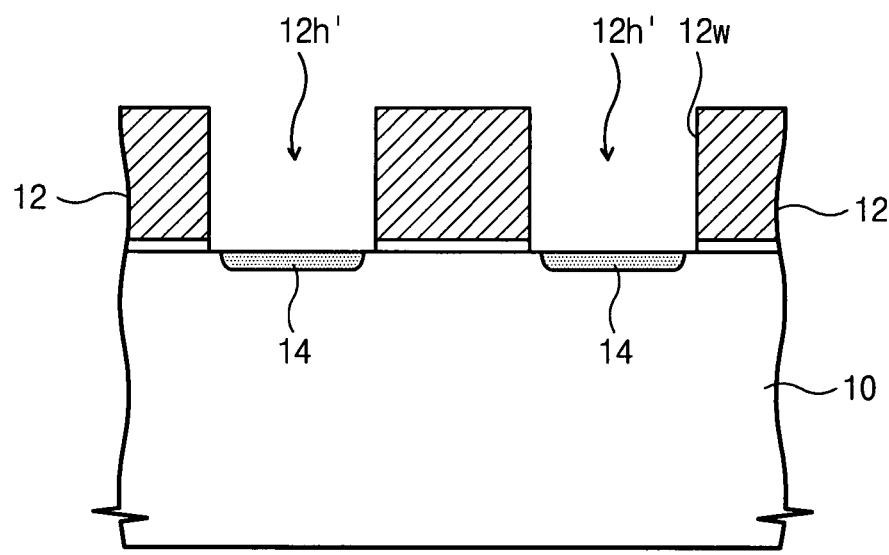
Figure 2E:
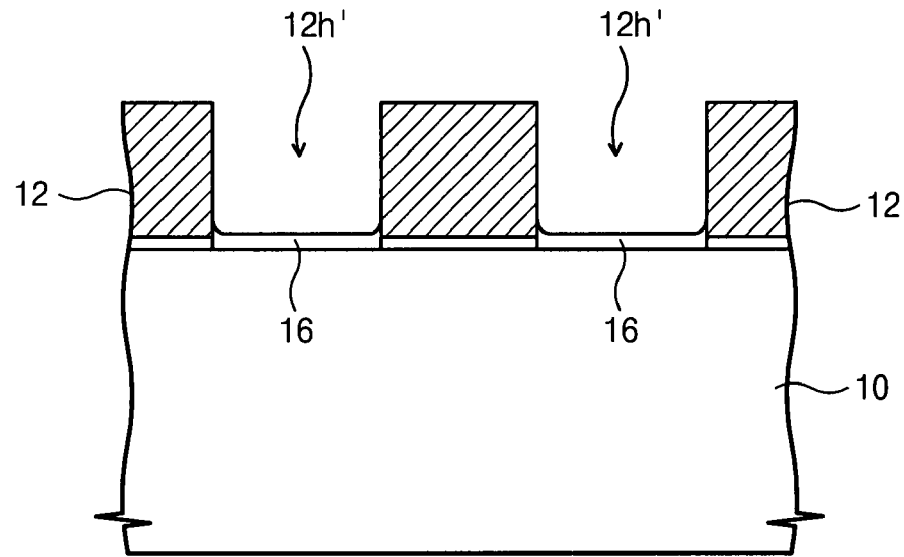

As illustrated in FIG. 2D, a second opening 12h' is then formed by enlarging the first opening 12h to expose an unnitrided region bordering the previously formed oxidation control region 14. For example, the first opening may be enlarged by etching the exposed sidewalls 12w of the mask pattern 12 using a wet etch process including, for example, in the case of a $SiO_2$ hard mask pattern, a buffered HF (BHF) dip followed by a suitable rinse. As illustrated in FIG. 2E, a gate dielectric layer 16 may then be formed on the regions of the substrate 10 exposed through the second openings 12h' using any technique capable of forming a dielectric layer exhibiting suitable uniformity and dielectric strength. If the gate dielectric is $SiO_2$, for example, the techniques may include thermal oxidation processes utilizing dry, wet or radical oxidation.

Figure 2F:
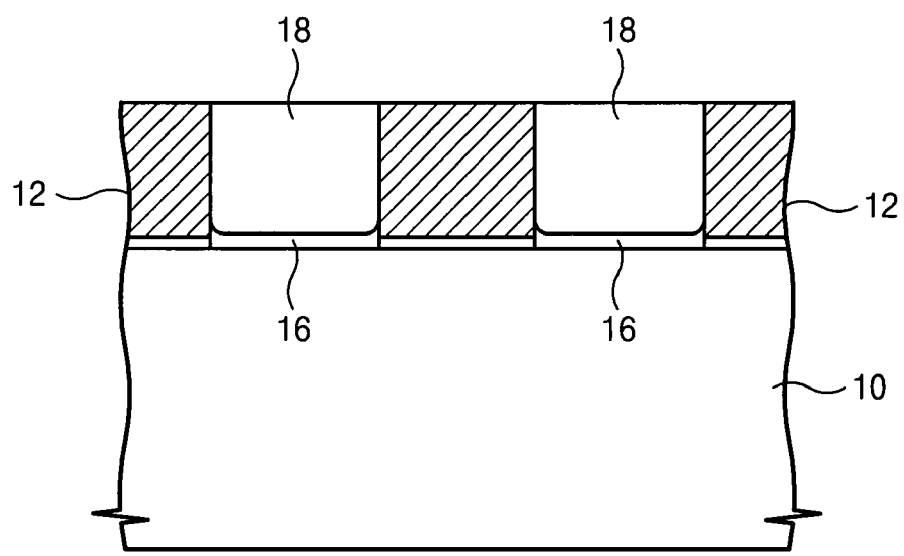

As a result of the oxidation control layer 14, the resulting gate dielectric layer 16 will exhibit a thinner center region surrounded by a thicker edge or peripheral region. For example, the SiN or nitride doping layer formed in the oxidation control layer will tend to suppress oxidation relative to the surrounding regions of the substrate exposed in the second openings 12h'. As illustrated in FIG. 2F, the remainder of the second openings 12h' may then be filled with one or more conductive materials including, for example, polysilicon, metals and/or metal compounds and then planarized by chemical mechanical polishing (CMP), etchback (EB) or a combination of methods to expose an upper surface of the mask pattern 12, with the remaining portions of the conductive material(s) forming a gate electrode pattern 18.

The polysilicon may be doped using a p-type dopant or, more typically, an n-type dopant, particularly phosphorus, to reduce its resistivity and may be formed by chemical vapor deposition (CVD), atomic layer deposition (ALD) or a suitable epitaxial process. The metals and metal compounds may include one or more materials selected from a group including, for example W, WN, WSi, TiN, TaN, TaCN, MoN, $Ta_2N$, Co, Ni, CoWP, $CoSi_x$, $NiSi_x$ and combinations and/or alloys thereof and may be formed using any suitable process including, for example, physical vapor deposition (PVD), CVD and ALD processes.

Figure 2G:
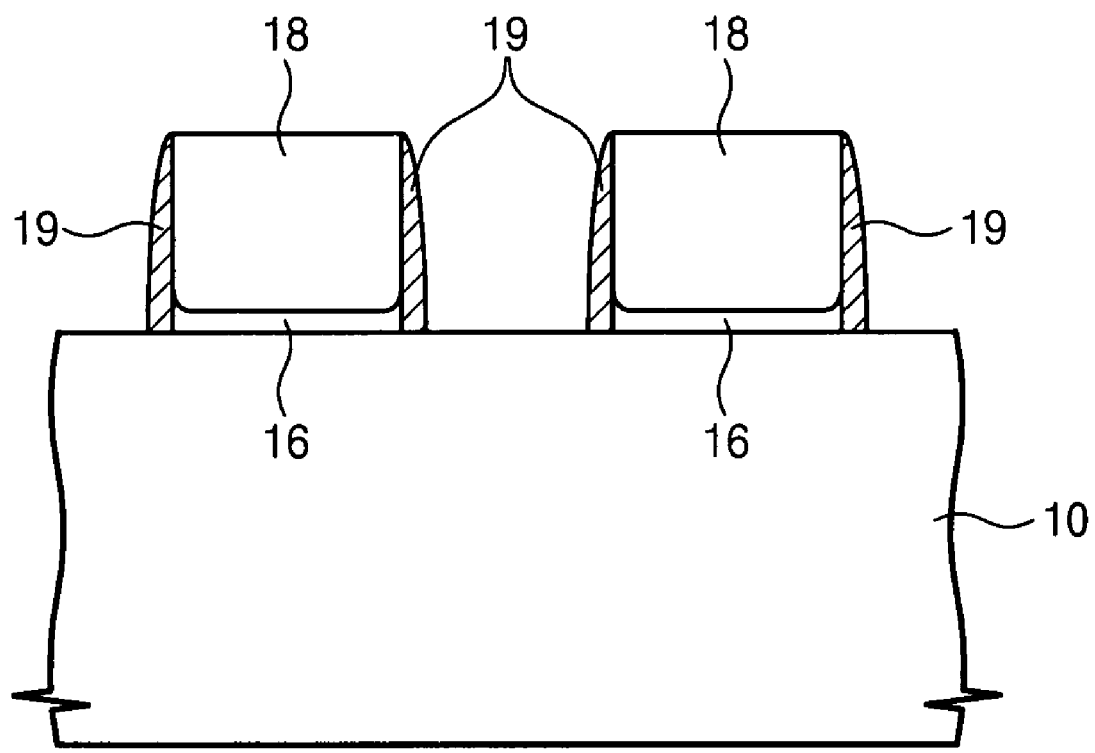

As illustrated in FIG. 2G, the hard mask pattern 12 may then be removed using a suitable etch or combination of etches. In those instances in which the hard mask pattern is formed from $SiO_2$, the hard mask pattern may be removed using a wet etch process. After the hard mask pattern 12 has been removed, sidewall spacers 19 may be formed on the sidewalls of the gate electrode 18 by forming a generally conformal SiN layer and then anisotropically etching the SiN layer. Source/drain regions may then be formed in the substrate by implanting one or more dopants into the substrate using the combination of the gate electrode 18 and the adjacent sidewall spacers 19 as an implant mask.

Figure 3A:
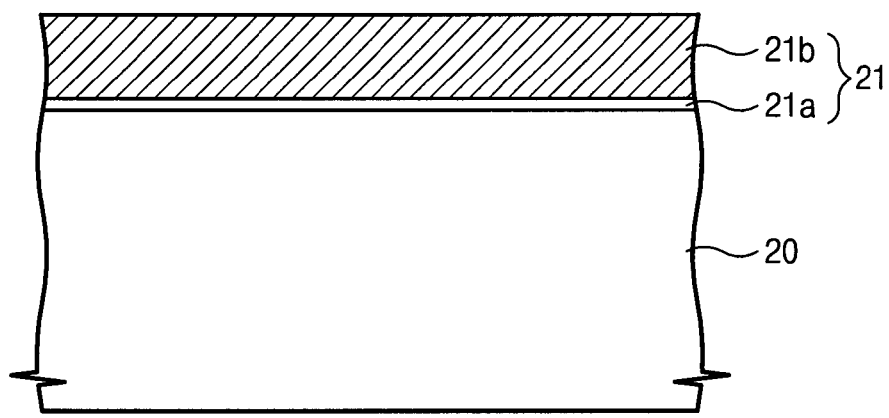
FIGS. 3A-3I are cross-sectional representations of a second example embodiment of a method for forming isolation structures and the resulting trench isolation structures.
Figure 3B:
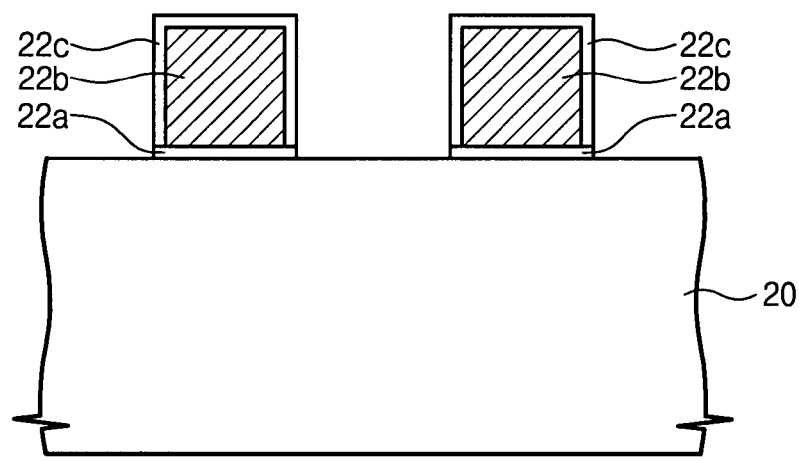

A second example embodiment is illustrated in FIGS. 3A-3I in which, as shown in FIG. 3A, a mask layer 21 comprising, in this instance, a pad oxide layer 21a, for example, thermal oxide, and a polysilicon layer 21b is formed on the substrate 20. As illustrated in FIG. 3B, for example, the mask layer 21 is then patterned with photoresist (not shown) and etched using a dry etch method to form a pad oxide pattern 22a and a polysilicon pattern 22b corresponding to the photoresist pattern. The photo-resist pattern (not shown) is then removed and a sidewall oxide layer 22c is formed on the sidewalls and top surfaces of the polysilicon pattern 22b by thermally oxidizing the polysilicon pattern. The thickness of the sidewall oxide layer 22c will typically be a function of the size of the gate electrode that will ultimately be formed for these devices.

Figure 3C:
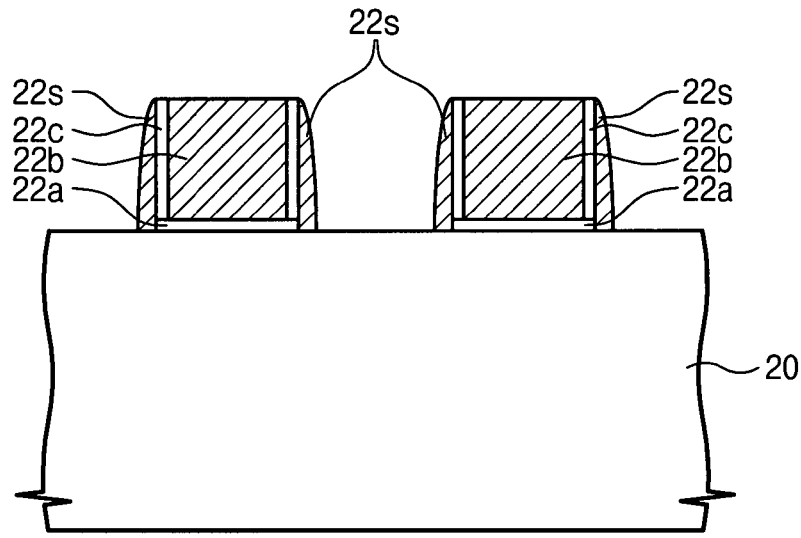

As illustrated in FIG. 3C, spacers 22s are formed on the sidewalls of the polysilicon pattern 22b by depositing a generally conformal dielectric layer and then using a anisotropic etch method to remove the majority of the dielectric layer. The spacers 22s may be formed using a dielectric material including, for example, silicon nitrides, silicon oxynitrides or combined layers. During the anisotropic etch used for forming the spacers 22s, the portion of the sidewall oxide layer 22c near the top of the extending to the top region of the polysilicon pattern 22b may be damaged only slightly or may be entirely removed.

Figure 3D:
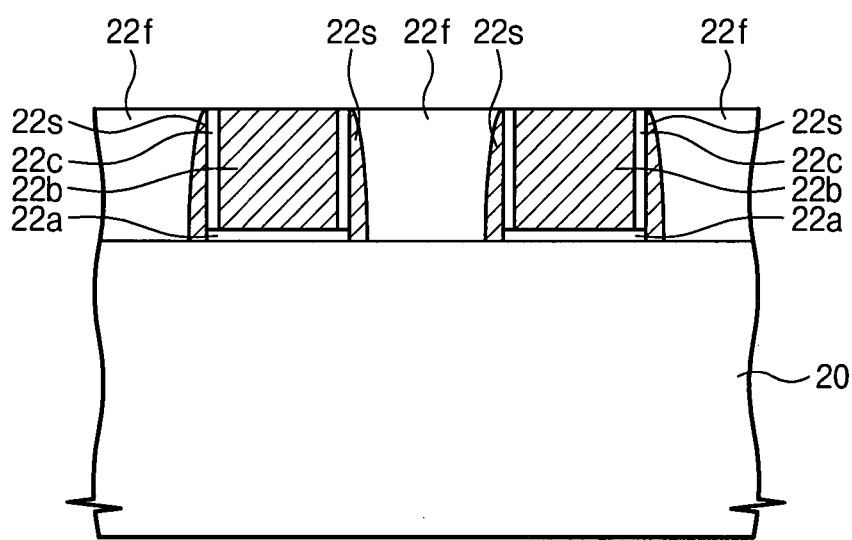

As illustrated in FIG. 3D, the opening between opposing spacers 22c provided on adjacent gate electrode patterns may be filled by depositing a silicon oxide layer (not shown) and then removing an upper portion of this layer using a CMP and/or EB process to form a silicon oxide pattern 22f and expose an upper surface of the spacers 22s and, as illustrated in FIG. 3D, possibly exposing am upper surface of the polysilicon pattern 22b. The polysilicon pattern 22b may then be removed using a wet etch method, thereby exposing the pad oxide pattern 22a.

Figure 3E:
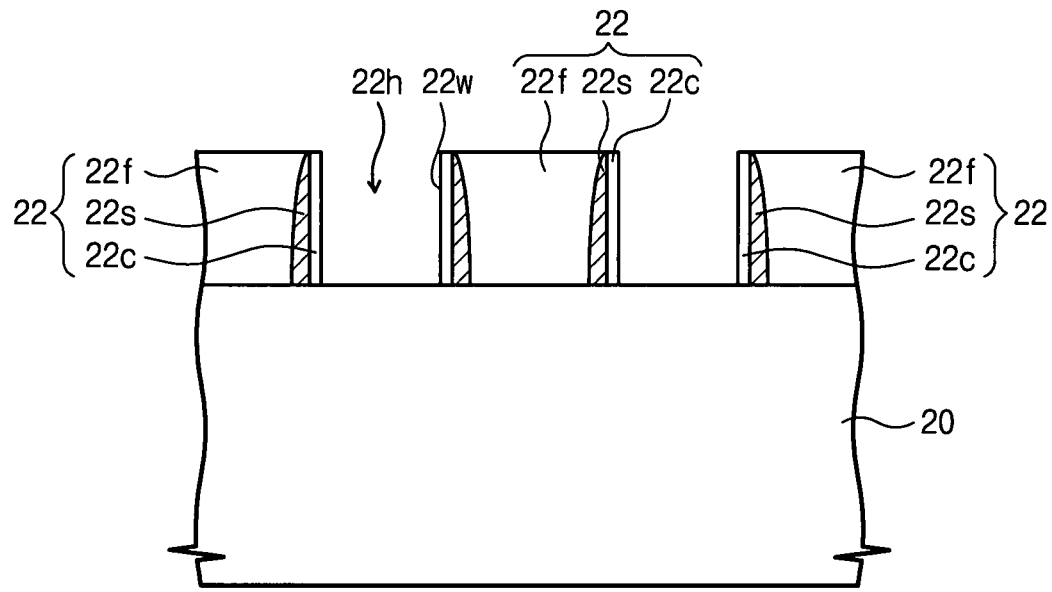
Figure 3F:
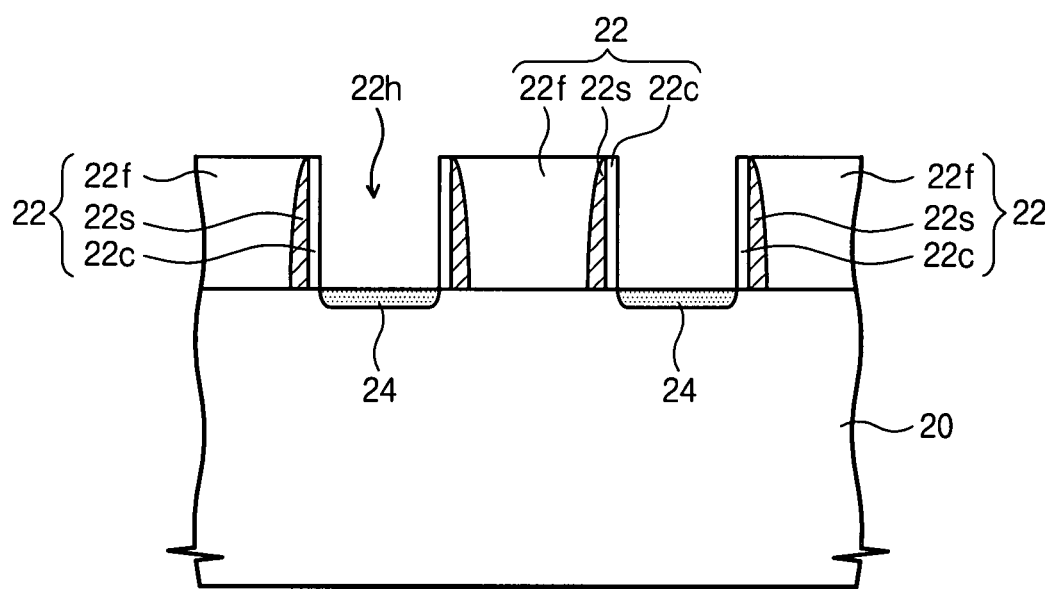

As illustrated in FIG. 3E, the pad oxide pattern 22a exposed by removing the polysilicon pattern 22a may then be removed from the surface of the substrate 20 using an anisotropic etch method. An upper portion of the pad oxide pattern 22a may be removed by the etch process with a remaining portion extending along the bottom region of the sidewall oxide layer 22c. As illustrated in FIG. 3F, an implant mask pattern 22 is formed from the remaining portions of the sidewall oxide 22c, the spacer 22s and the silicon oxide 22f. The mask pattern 22 has sidewalls 22w bordering a first opening 22h in which the first opening is no more than about 90 percent of the target size of the final gate electrode.

Figure 3G:
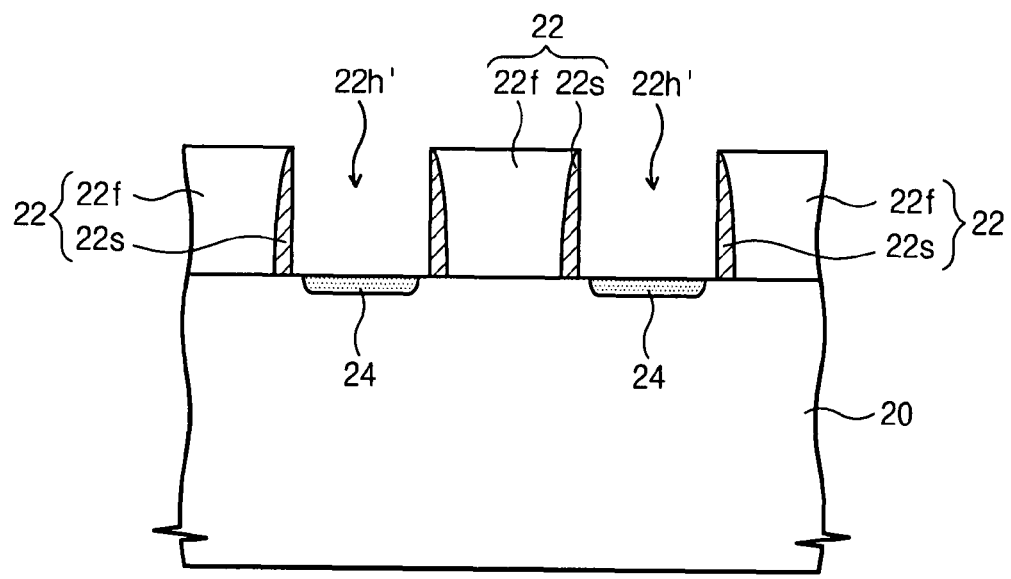

As illustrated in FIG. 3F, an oxidation control region 24 is then formed on those regions of the substrate 20 exposed by the first openings 22h using one or more of the nitridation techniques detailed above. As illustrated in FIG. 3G, second openings 22h' are then formed to extend the openings through the hard mask 22 beyond the boundaries of the oxidation control region 24 by, for example, etching the spacer 22s using an isotropic etch. For example, where $SiO_2$ is utilized as a spacer, a conventional wet etch process using HF may be employed to enlarge the openings.

Figure 3H:
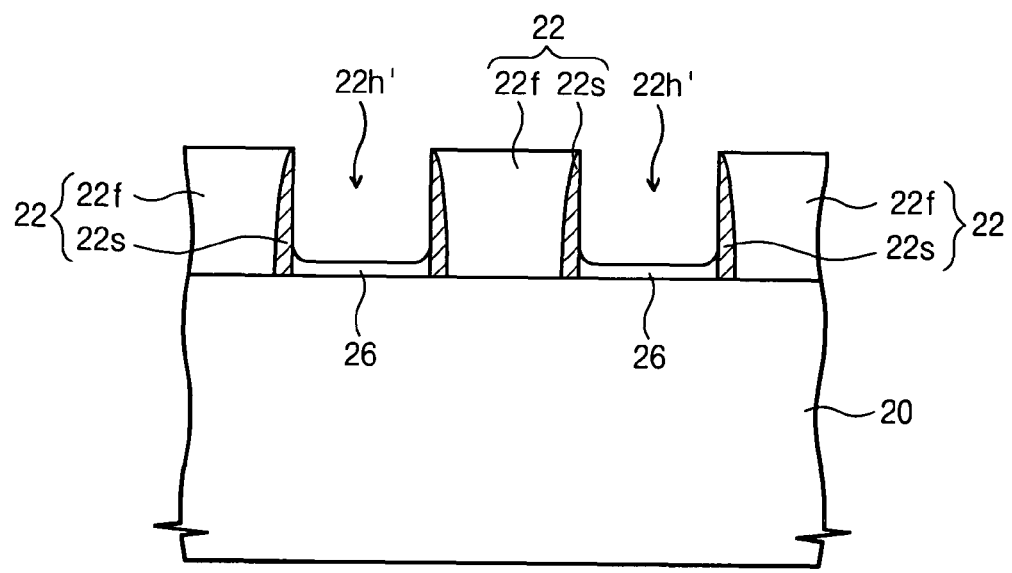

The portions of the substrate 20 exposed through the second openings 22h' comprises a center portion including the oxidation control region 24 and an edge portion that extends beyond the oxidation control region. As illustrated in FIG. 3H, a gate dielectric layer 26 is then formed on those regions of the substrate 20 exposed through the second opening 22h' using a thermal oxidation process including dry, wet or radical oxidation.

Figure 3I:
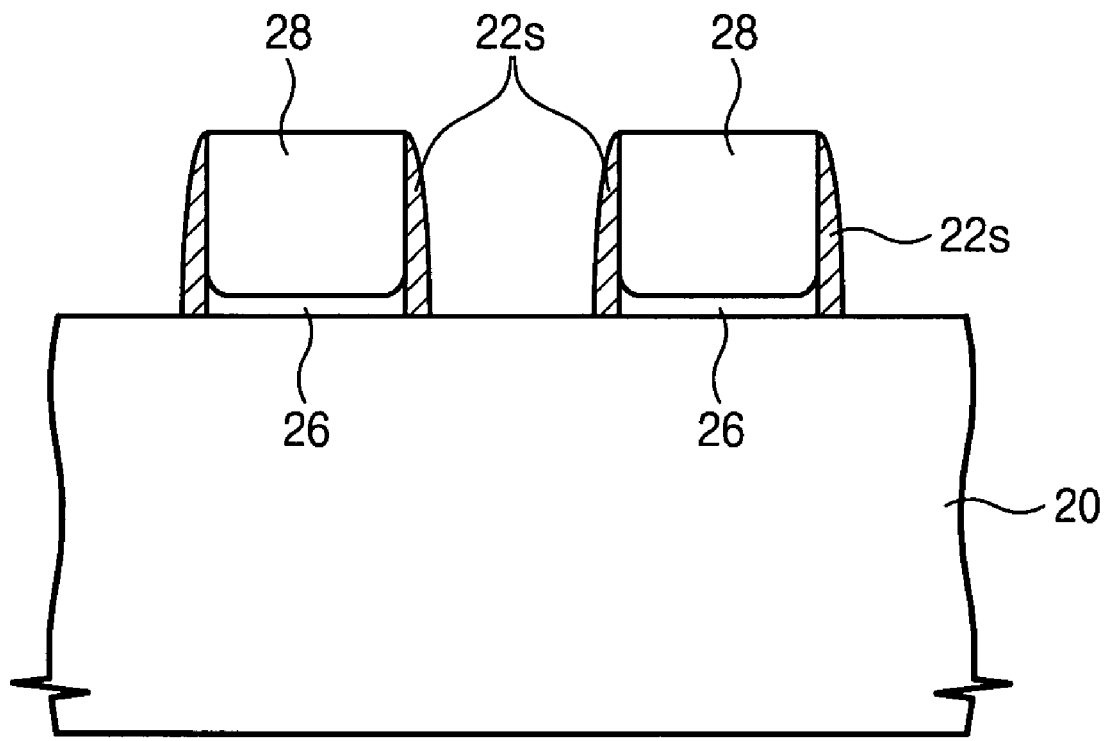

As a result of the oxidation control region 24, the gate dielectric layer 26 will be asymmetric in that the edge portions will tend to be thicker than the center portion that generally corresponds to the oxidation control region. As illustrated in FIG. 3I, gate electrode 28 may then be formed on the regions of the substrate exposed within the second openings 22h' by filling the opening with one or more conductive materials, typically polysilicon, metals and/or metal compounds. The upper portions of the conductive materials may then be removed using a CMP or EB process to form and planarize the conductive pattern separated by the mask pattern 22. The semiconductor device may then be subjected to additional processing, including that detailed above with respect to the first example embodiment.

Figure 4A:
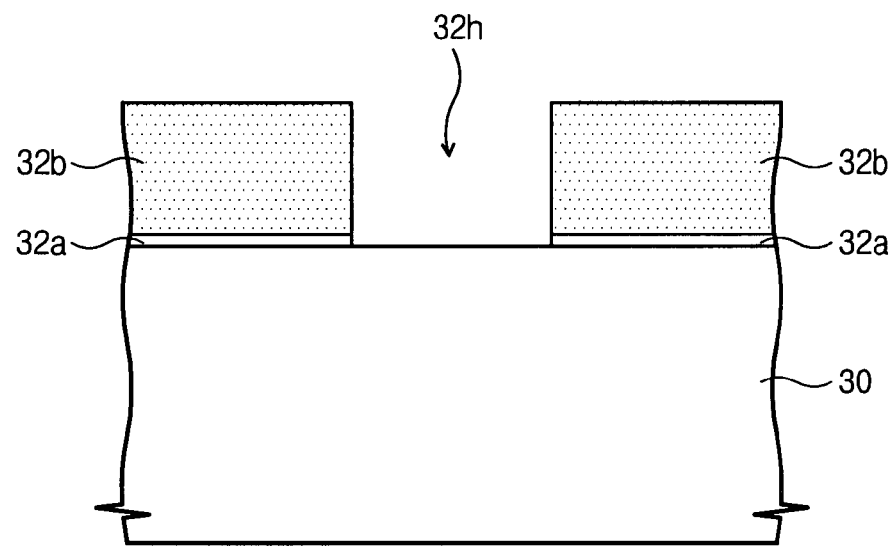
FIGS. 4A-4F are cross-sectional representations of a second example embodiment of a method for forming isolation structures and the resulting trench isolation structures.

Another example embodiment is illustrated in FIGS. 4A-4F in which, as illustrated in FIG. 4A, a mask layer comprising a pad oxide layer and silicon nitride layer is formed on a substrate 30. The mask layer may then be patterned and etched using conventional photolithography and etch processes including, for example, forming a photoresist pattern (not shown) and etching the exposed regions of the mask layer to expose portions of the substrate 30 and to form a pad oxide pattern 32a and a silicon nitride pattern 32b, thereby defining a first opening 32h having sidewalls and exposing the portion of the substrate. Unlike the example embodiments discussed above, however, the size of the first opening 32h will typically correspond to the target size of the gate electrode that will be formed on the substrate.

Figure 4B:
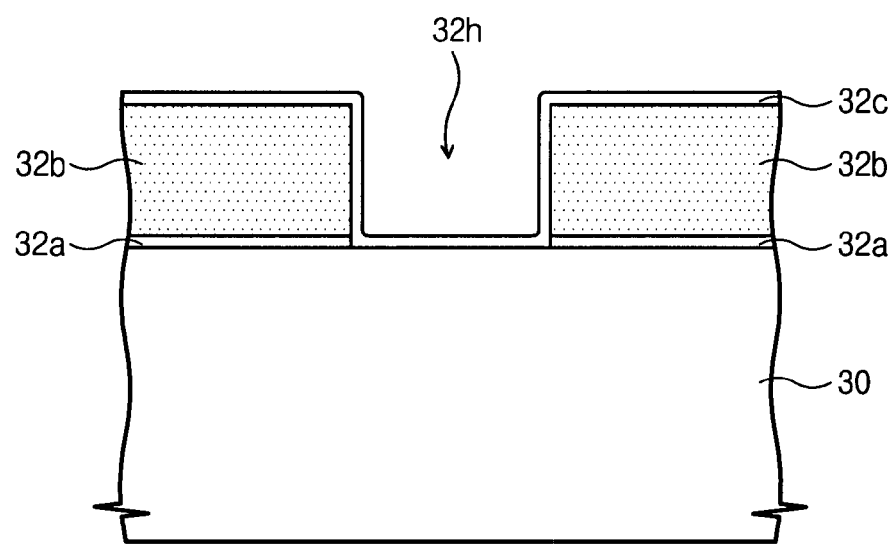

As illustrated in FIG. 4B, a conformal dielectric layer 32c may then be formed on the mask pattern 32a, 32b and the exposed portions of the substrate 30 with the conformal dielectric layer being formed of a material selected for its etch selectivity relative to the materials used to form the mask layer. For example, the conformal dielectric layer 32c may comprises MTO (medium temperature silicon oxide).

Figure 4C:
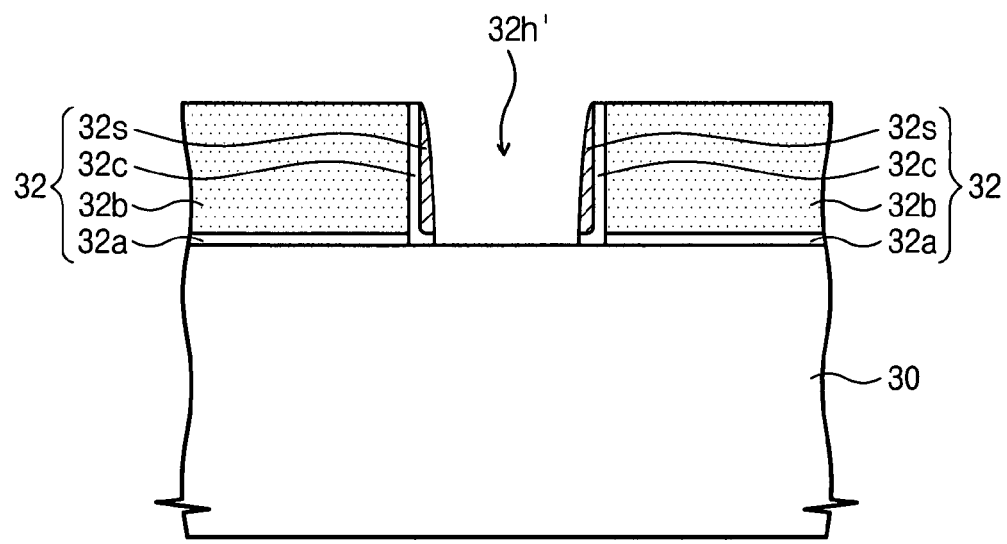
Figure 4D:
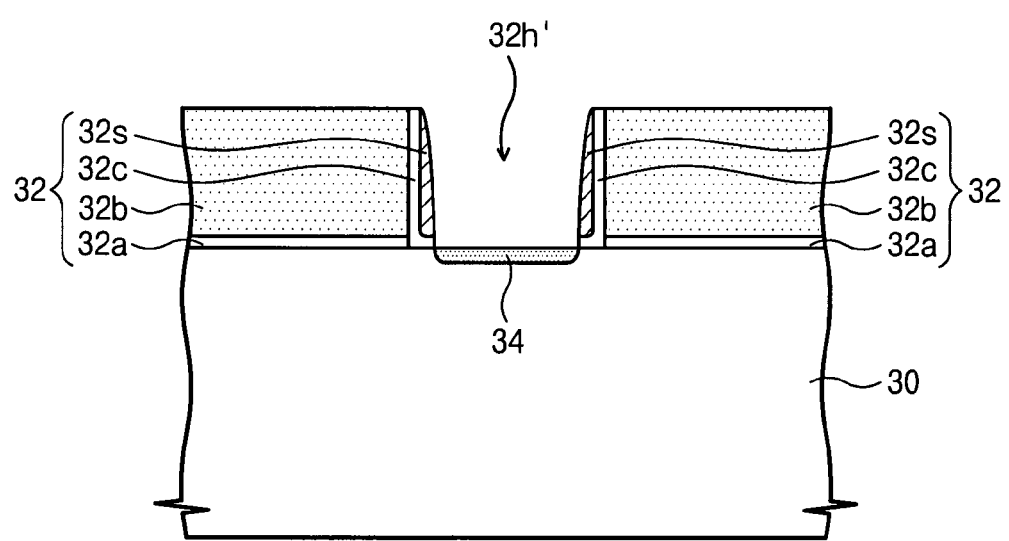

As illustrated in FIG. 4C, spacers 32s may then be formed on the sidewalls of the mask pattern by depositing a conformal material layer including, for example, polysilicon, that exhibits an etch selectivity relative to the material used in forming the conformal dielectric layer 32c and then anisotropically etching the conformal layer to form, in this instance, polysilicon sidewall spacers 32s. As illustrated in FIG. 4C, a conformal dielectric layer 32c exposed between the spacers 32s may be selectively removed to expose the substrate 30 using wet etch process, thereby forming a mask pattern 32 having second openings 32h' As illustrated in FIG. 4D, an oxidation control region 34 is then formed on those portions of the substrate exposed through the second opening 32h' using one or more suitable nitridation processes including, for example, those processes detailed above.

Figure 4E:
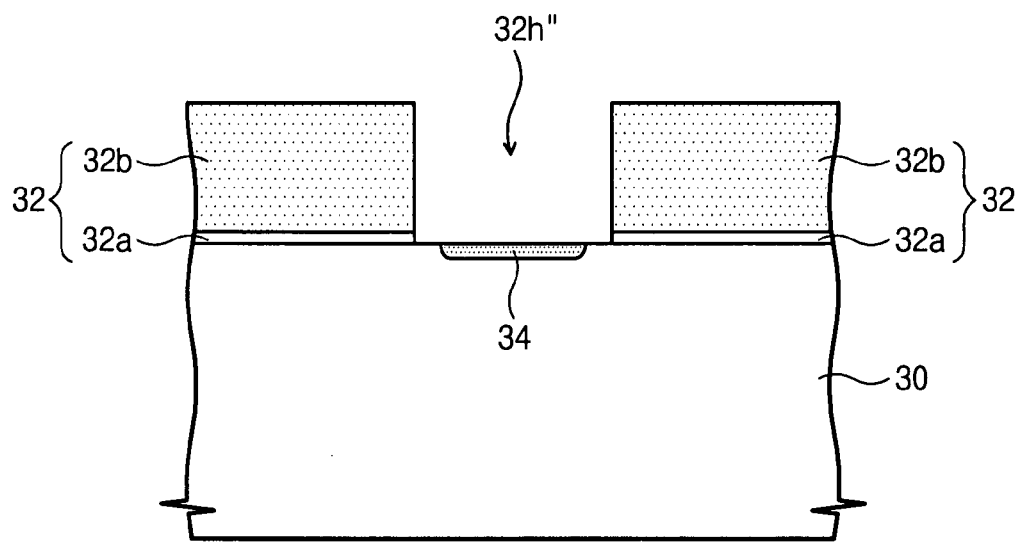

As illustrated in FIG. 4E, the second opening 32h' may be enlarged to form a third opening 32h" by selective etching the spacer 32s of the sidewall of the mask pattern 32. The conformal dielectric pattern 32c may also be selectively removed using a wet etch including HF to form the third opening 32h" that exhibits a width in excess of that provided by the second opening 32h'. The regions of the substrate 30 exposed through the third opening 32h" comprise a center portion having the oxidation control portion 34 and an edge portion that does not have the oxidation control region.

Figure 4F:
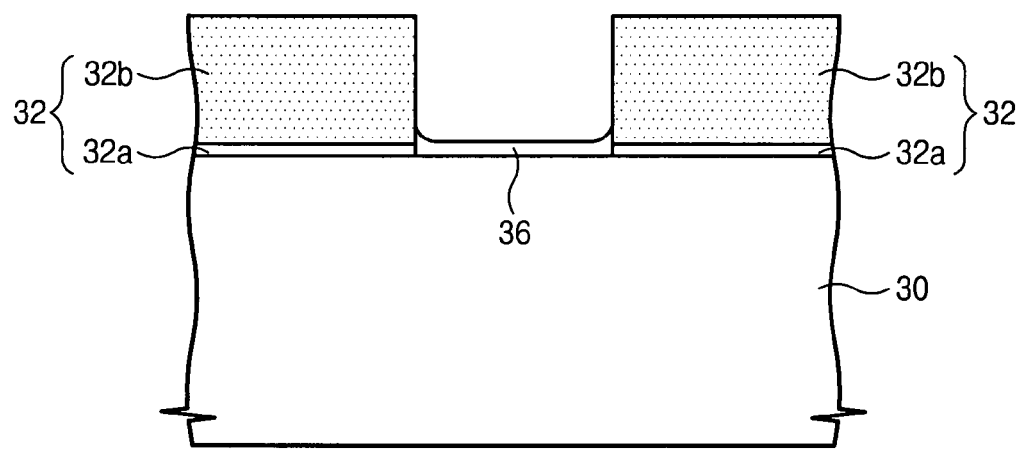

As illustrated in FIG. 4F, a gate dielectric layer 36 is then formed on those regions of the substrate 30 exposed through the third opening 32h" using a thermal oxidation method that may include, for example, dry, wet or radical oxidation processes. The gate dielectric layer 36 will not be uniform but will instead exhibit a thinner central portion surrounded by a thicker edge or peripheral portion as a result of the oxidation suppression achieved in the center portion of the exposed regions of the substrate 30.

The semiconductor device may then be subjected to additional processing, including that detailed above with respect to the first and/or second example embodiments.

Figure 5A:
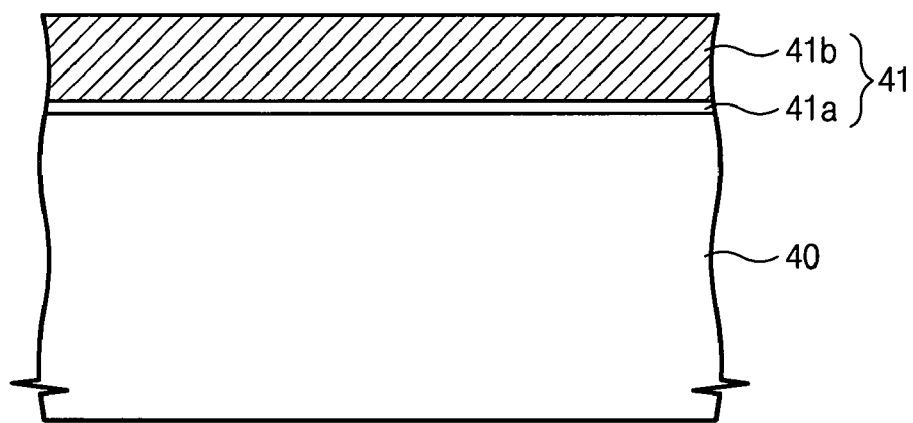
FIGS. 5A-5F are cross-sectional representations of a second example embodiment of a method for forming isolation structures and the resulting trench isolation structures.

Another example embodiment is illustrated in FIGS. 5A-5F in which, as illustrated in FIG. 5A, a pre-mask 41 is formed on the substrate 40. The pre-mask 41 comprises a pad oxide layer 41a and a hard mask layer 41b that exhibits an etch selectivity relative to the pad oxide layer, such as silicon nitride or silicon oxynitride.

Figure 5B:
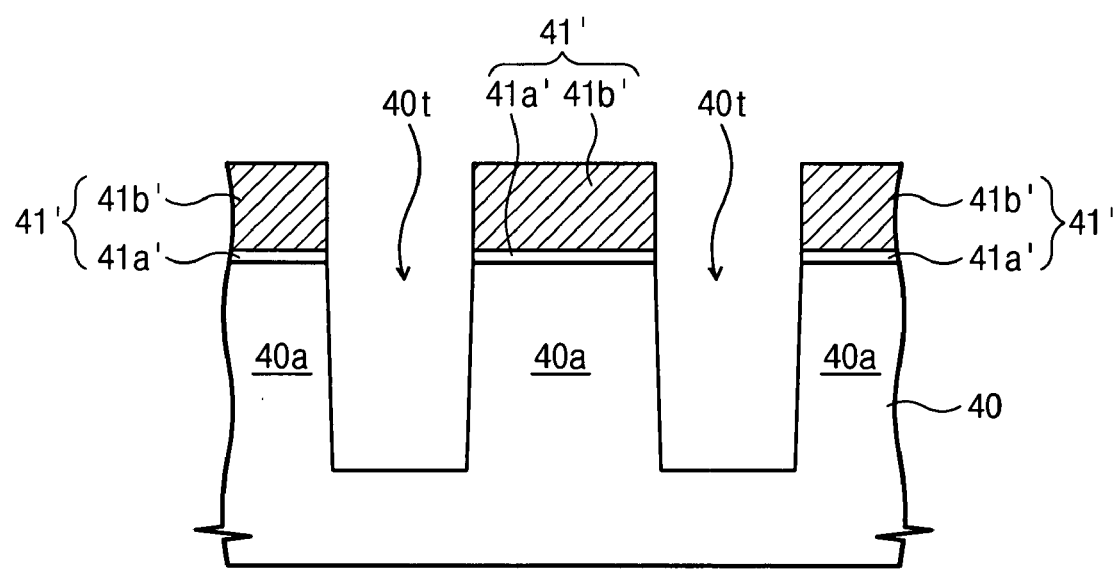

As illustrated in FIG. 5B, a pre-mask pattern 41' may be formed by patterning the pre-mask layer 41 using conventional photolithography and dry etch processes. The pre-mask pattern 41' comprises a pad oxide pattern 41a' and a hard mask pattern 41b'. A trench 40t is formed by etching the substrate 40 using the pre-mask pattern 41' as an etch mask to define active regions 40a between the trenches 40t of the substrate 40.

Figure 5C:
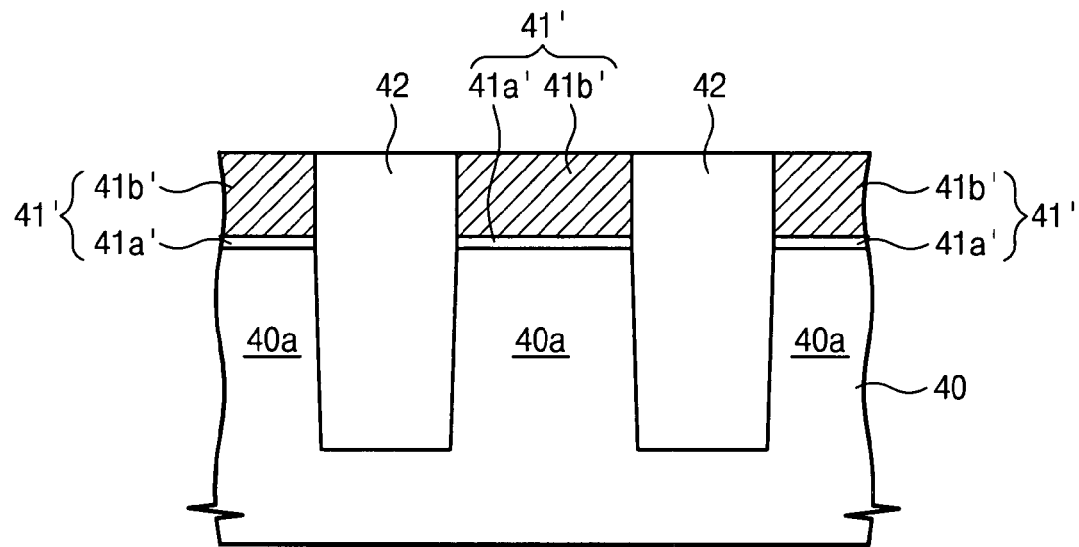

As illustrated in FIG. 5C, the trenches 40t are then filled with a dielectric material, for example, a high density plasma oxide, plasma enhanced oxide, thermal oxide, silicon nitride and a combination thereof. The dielectric material layer(s) may then be planarized using a CMP and/or EB process to expose an upper surface of the pre-mask pattern 41' and thereby form the trench isolation dielectric pattern 42.

Figure 5D:
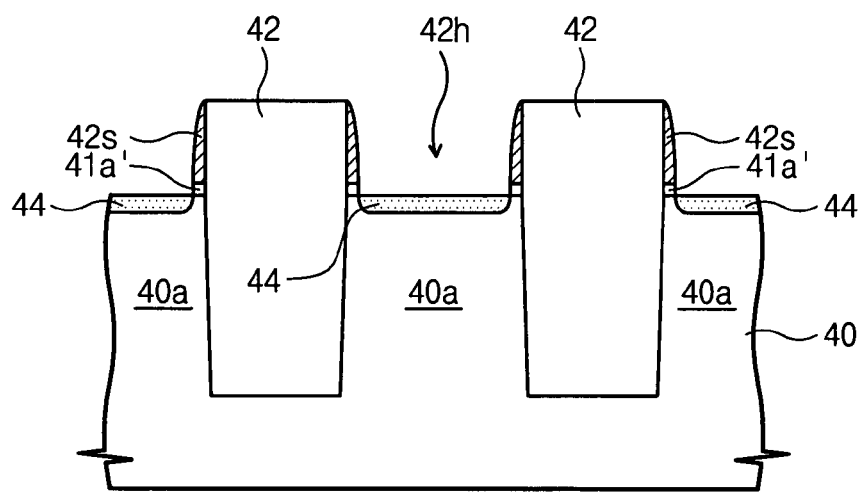

As illustrated in FIG. 5D, a portion of the pre-mask pattern 41' may be removed with an anisotropic etch process while concurrently forming spacers 42s comprising residual portions of the hard mask pattern 41b' and pad oxide pattern 41a' from the pre-mask pattern 41' on the sidewalls of the device isolation dielectric pattern 42 and expose a central portion of the active region 40a. The combination of the trench isolation dielectric pattern 42, the spacer 42s and the pad oxide pattern 41a' acts as a mask pattern having first opening 42h that exposes a central portion of the active region 40a.

As illustrated in FIG. 5D, an oxidation control region 44 is then formed in the portion of the active region 40a exposed through the first opening 42h using one or more of the nitridation processes discussed above.

Figure 5E:
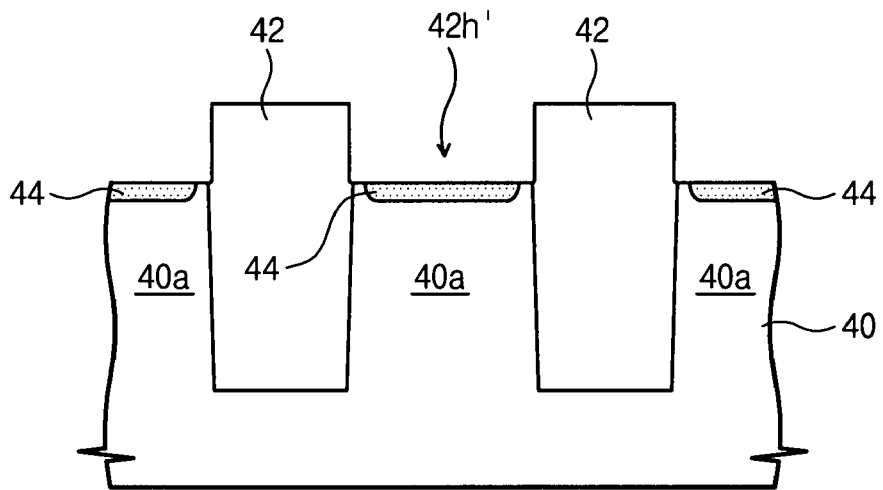

As illustrated in FIG. 5E, a second opening 42h' larger than the first opening 42h and larger than the oxidation control region 44 is then formed by an isotropic etch of the spacer 42s and the pad oxide pattern 41a' using, for example, a wet etch utilizing HF. As will be appreciated, the process of removing the spacers may also remove a portion of the sidewall of the trench isolation dielectric pattern 42.

Figure 5F:
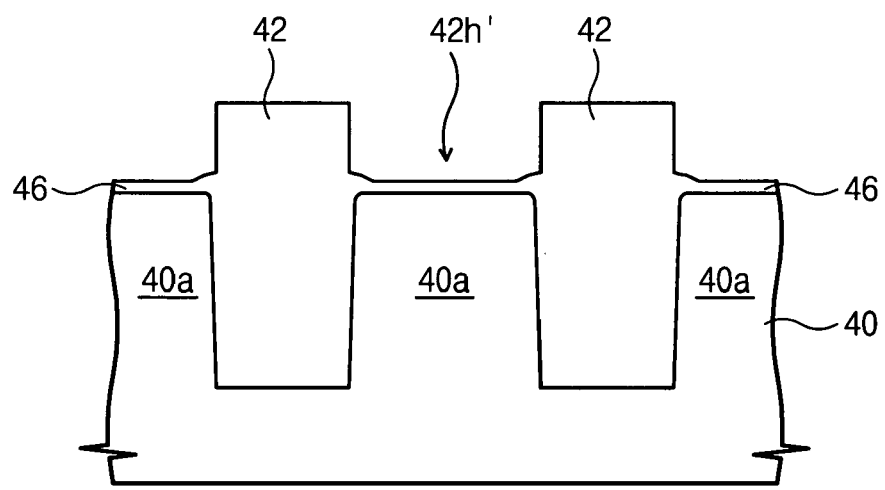

The active region 40a of the substrate 40 exposed through the second opening 42h' comprises a central portion including the oxidation control region 44 and an edge portion formed outside the oxidation control region 44. As illustrated in FIG. 5F, a gate dielectric layer 46, or tunneling dielectric layer, may then be formed on the active region 40a of the substrate 40 exposed through the second opening 42h' by utilizing one or more thermal oxidation processes including dry, wet and/or radical oxidation processes.

As a result of the oxidation control region 44, the gate dielectric layer 46 will tend to exhibit a thinner central portion surrounded by or bounded by a thicker edge portion as a result of the suppression of oxidation in the central portion of the active region provided by the oxidation control material.

Figure 6:
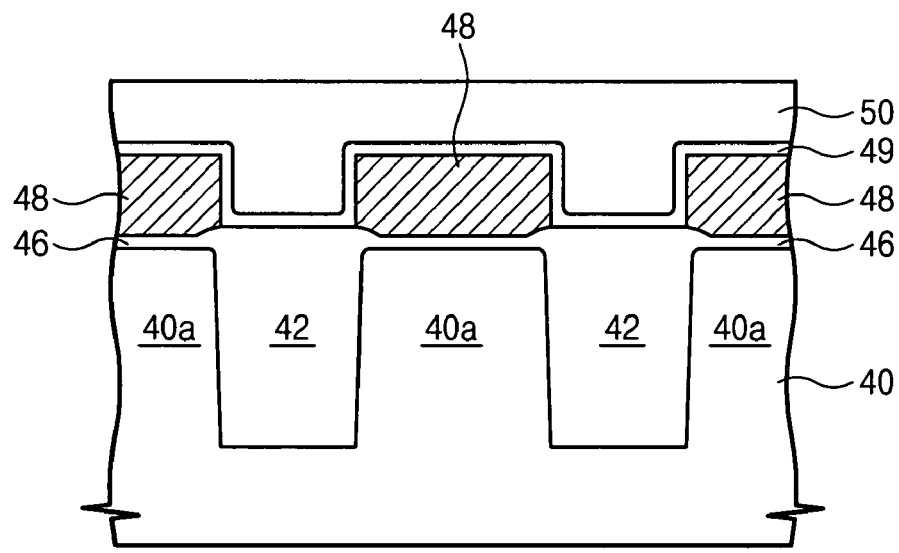
FIGS. 6 and 7 are cross-sectional representations semiconductor device configurations incorporating gate dielectric structures fabricated using example embodiments of methods according to the description and figures provided herein.

As illustrated in FIG. 6, the structure illustrated in FIG. 5F may be subjected to additional processing to provide a floating gate configuration including floating gate electrode 48 in the second opening 42h' by filling the opening with a conductive layer, for example, polysilicon, and planarizing the conductive layer to expose the trench isolation dielectric pattern 42. As reflected in FIG. 6, the upper surface of the trench isolation oxide pattern 42 is recessed relative to the upper surface of the floating gate 48. A blocking dielectric layer 49 and control gate electrode 50 may then be formed sequentially over the floating gate electrode. As reflected in FIG. 6, the trench isolation oxide pattern 42 extends slightly above the gate dielectric layer 46.

Figure 7:
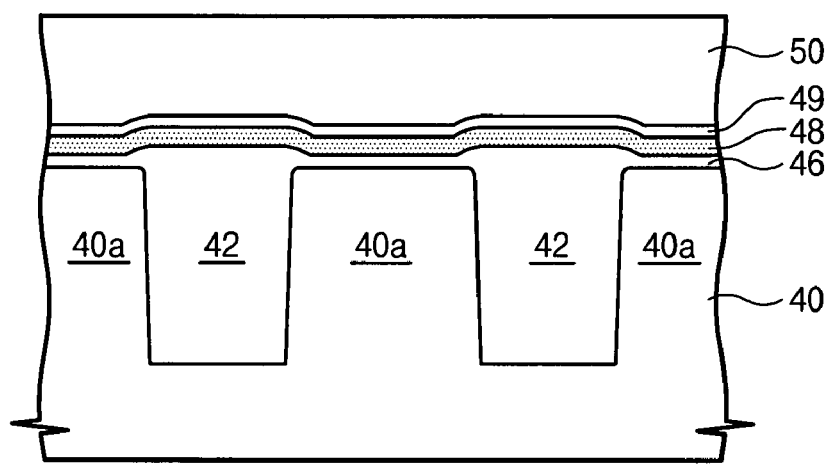

As illustrated in FIG. 7, the structure illustrated in FIG. 5F may be subjected to additional processing to provide a SONOS type configuration including a charge storing layer 48, for example, a dot layer comprising a plurality of dot shaped conducting material(s) or dot-shaped insulating material(s), a charge trap layer or a combination thereof may be formed. As illustrated in FIG. 7, a blocking dielectric layer 49 and a control gate electrode 50 may then be formed sequentially on the charge-storing layer 48. Both the floating gate, FIG. 6, and SONOS type, FIG. 7, devices exhibit a tunneling dielectric layer having increased thickness in the edge or peripheral portions.

The example embodiments of the methods and the resulting device structures will tend to provide electric field relief at the edges of the gate electrode and will help to maintain gate electrode conductivity by reducing the resistance increases associated with the conventional GPOX processes by removing the need for a gate poly oxidation process during the fabrication of these semiconductor devices.

As will be appreciated by those skilled in the art from the description above and the corresponding Figures, example embodiments include methods of fabricating trench isolation and gate dielectric structures that may provide reduced leakage, improved process yield and/or improved reliability by reducing the leakage associated with the increased electric fields associated with the edges of the gate electrode structures.

As will be appreciated by those skilled in the art, other combinations of insulating, semiconducting and conducting materials may be utilized in practicing methods in accord with the example embodiments detailed above. Such alternative combinations of materials, however, should be selected to provide appropriate combinations of properties whereby the trench isolation and gate dielectric structures illustrated above may be reproduced. Appropriate combinations of the properties include, for example, combinations dielectric materials capable of reducing leakage, e.g., HDP oxide, and, where necessary, providing for the noted etch selectivity whereby structures can be removed using isotropic etch processes. Similarly, those skilled in the art will appreciate that a variety of conductive materials may be utilized in constructing composite or laminar gate electrode structures and that such variations are encompassed by the present disclosure.

Accordingly, although certain example embodiments have been disclosed for illustrative purposes, those skilled in the art will appreciate that various conventional modifications, additions and substitutions to the particular materials and techniques are possible, without departing from the scope and spirit of the disclosure.

We claim:

1. A method of fabricating a semiconductor device comprising, in order:
    forming a mask pattern on a semiconductor substrate, wherein the mask pattern includes first openings having a uniform width $W_1$ that expose first regions of the semiconductor substrate;
    forming an oxidation control region by nitriding a surface portion of the exposed first regions;
    removing portions of the mask pattern adjacent the first openings to form second openings having a width $W_2$, wherein $W_2 > W_1$ thereby exposing peripheral portions of the semiconductor substrate bounding the oxidation control region;
    oxidizing the exposed semiconductor substrate to form a dielectric pattern wherein a central region has a first average thickness $T_c$ and wherein peripheral regions adjacent the central region have a second average thickness $T_p$, wherein $T_p > T_c$,
    wherein the removed portions of the mask pattern and other portions of the mask pattern are made of the same material.

2. The method of fabricating a semiconductor device according to claim 1, further comprising, in order:
    forming a conductive pattern on the dielectric pattern;
    removing the mask pattern to expose second regions of the semiconductor substrate;
    forming spacer structures on opposite sidewalls of the conductive pattern covering peripheral regions of the second regions and thereby defining source/drain regions between adjacent portions of the conductive pattern;
    implanting a dopant into the semiconductor substrate in the source/drain region to form source/drain structures.

3. The method of fabricating a semiconductor device according to claim 2, further comprising:
    implanting a dopant into the exposed second regions of the semiconductor substrate before forming the spacer structures to form a lightly-doped drain (LDD) structure.

4. The method of fabricating a semiconductor device according to claim 1, further comprising, in order:
    forming a conductive pattern on the dielectric pattern;
    removing the mask pattern to expose second regions of the semiconductor substrate;
    forming spacer structures on opposite sidewalls of the conductive pattern covering peripheral regions of the second regions.

5. The method of fabricating a semiconductor device according to claim 1, wherein:
    a ratio of the first average thickness $T_c$ to the second average thickness $T_p$ is no greater than 0.5.

6. The method of fabricating a semiconductor device according to claim 1, wherein forming the mask pattern further comprises:
    forming a thermal oxide layer having a thickness $T_t$ on the semiconductor substrate; and
    depositing a CVD oxide having a thickness $T_{cvd}$ on the thermal oxide layer, wherein the ratio $T_{cvd}:T_t$ is at least 3.

7. The method of fabricating a semiconductor device according to claim 1, wherein nitriding the surface portions of the exposed first regions further comprises:

exposing the surface portions to an activated nitrogen containing ambient.

8. The method of fabricating a semiconductor device according to claim 7, wherein:

the activated nitrogen ambient is applied using a method selected from a group consisting of in-situ plasma, remote plasma, nitrogen annealing, nitrogen ion implant and rapid thermal nitridation.

9. The method of fabricating a semiconductor device according to claim 8, wherein:

the selected method incorporates a nitrogen source gas selected from a group consisting of $N_2$, $NH_3$, NO, $N_2O$ and mixtures thereof.

10. The method of fabricating a semiconductor device according to claim 1, wherein:

the width of the first opening $W_1$ is no more than 80% of the width of the second openings $W_2$.

11. The method of fabricating a semiconductor device according to claim 1, wherein:

the width of the first opening $W_1$ is no more than 70% of the width of the second openings $W_2$.

12. The method of fabricating a semiconductor device according to claim 1, wherein:

the central region has a first dielectric composition having a first average nitrogen content $C_{N1}$ and wherein peripheral regions adjacent the central region have a second dielectric composition having a second average nitrogen content $C_{N2}$, wherein $C_{N1} > C_{N2}$.

13. A method of fabricating a semiconductor device comprising, in order:

forming a mask pattern on a semiconductor substrate, wherein the mask pattern includes first openings having a uniform width $W_1$ that expose first regions of the semiconductor substrate, wherein the mask pattern comprising an initial oxide pattern and a secondary pattern on a upper surface of the initial oxide pattern;

forming an oxidation control region by nitriding a surface portion of the exposed first regions of the semiconductor substrate;

removing portions of the initial oxide pattern and the secondary pattern adjacent the first openings to form second openings having a width $W_2$, wherein $W_2 > W_1$, thereby exposing peripheral portions of the semiconductor substrate bounding the oxidation control region;

oxidizing the exposed semiconductor substrate to form a dielectric pattern wherein a central region has a first average thickness $T_c$ and wherein peripheral regions adjacent the central region have a second average thickness $T_p$, wherein $T_p > T_c$.

14. The method of fabricating a semiconductor device according to claim 13, wherein the secondary pattern is CVD oxide pattern.

15. The method of fabricating a semiconductor device according to claim 13, wherein the nitriding process is a diffusion process performed by in-situ plasma, remote plasma, nitrogen annealing or rapid thermal nitridation.

16. The method of fabricating a semiconductor device according to claim 13, wherein the mask pattern includes sidewalls substantially parallel to each other.

* * * * *